(12) United States Patent
Wu et al.

(10) Patent No.: US 8,846,523 B2
(45) Date of Patent: Sep. 30, 2014

(54) PROCESS OF FORMING THROUGH-SILICON VIA STRUCTURE

(71) Applicant: Taiwan Semiconductor Manufacturing Company, Ltd., Hsinchu (TW)

(72) Inventors: Weng-Jin Wu, Hsinchu (TW); Yung-Chi Lin, Sun-Lin (TW); Wen-Chih Chiou, Miaoli (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/854,230

(22) Filed: Apr. 1, 2013

(65) Prior Publication Data

US 2013/0224909 A1    Aug. 29, 2013

Related U.S. Application Data

(62) Division of application No. 12/783,973, filed on May 20, 2010, now Pat. No. 8,432,038.

(60) Provisional application No. 61/186,575, filed on Jun. 12, 2009.

(51) Int. Cl.
*H01L 21/4763* (2006.01)

(52) U.S. Cl.
USPC ............. 438/629; 257/773; 257/E21.577; 257/E21.585

(58) Field of Classification Search
CPC ............... H01L 21/76879; H01L 21/76877
USPC ............ 257/773, E21.577, E21.585; 438/629
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,214,731 B1 | 4/2001 | Nogami et al. |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,548,395 B1 | 4/2003 | Woo et al. |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |

(Continued)

OTHER PUBLICATIONS

OA from corresponding application No. CN 201010543649.X.

*Primary Examiner* — Yu-Hsi D Sun
(74) *Attorney, Agent, or Firm* — Lowe Hauptman & Ham, LLP

(57) ABSTRACT

In a process, an opening is formed to extend from a front surface of a semiconductor substrate through at least a part of the semiconductor substrate. A metal seed layer is formed on a sidewall of the opening. A metal silicide layer is formed on at least one portion of the metal seed layer. A metal layer is formed on the metal silicide layer and the metal seed layer to fill the opening.

19 Claims, 4 Drawing Sheets

(56) References Cited

U.S. PATENT DOCUMENTS

| | | |
|---|---|---|
| 6,841,883 B1 | 1/2005 | Farnworth et al. |
| 6,867,135 B1 | 3/2005 | Bao et al. |
| 6,881,665 B1 | 4/2005 | Tsui et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,521,360 B2 | 4/2009 | Halahan et al. |
| 7,625,788 B2 | 12/2009 | Chen et al. |
| 7,892,972 B2 | 2/2011 | Akram et al. |
| 8,097,955 B2 | 1/2012 | Zimmermann et al. |
| 2005/0280118 A1* | 12/2005 | Lin et al. .................. 257/618 |
| 2006/0250080 A1 | 11/2006 | Yamazaki et al. |
| 2007/0184654 A1* | 8/2007 | Akram et al. .............. 438/675 |
| 2008/0113505 A1 | 5/2008 | Sparks et al. |
| 2008/0113508 A1* | 5/2008 | Akolkar et al. ............ 438/687 |
| 2008/0303170 A1 | 12/2008 | Tanida et al. |
| 2009/0235746 A1 | 9/2009 | Mutharasan et al. |
| 2010/0130002 A1* | 5/2010 | Dao et al. .................. 438/628 |
| 2010/0230818 A1 | 9/2010 | Birner et al. |

* cited by examiner same to avoid a seam or void defect generated therein. The term "aspect ratio" is intended to describe a height-to-width ratio of any opening formed in a material layer. The term "high aspect ratio" in this disclosure refers to a height-to-width ratio of an opening greater than 5. Embodiments of the metallization process are also applicable in forming a through-silicon via (TSV) structure. As used throughout this disclosure, the term "through-silicon via (TSV)" refers to an opening filled with a conductive material passing through at least a part of a semiconductor substrate or a silicon-containing substrate. Embodiments provide the use of copper metallization in forming TSVs as well as the use of copper electroplating techniques to fill high aspect ratio openings to avoid a seam or void defect. As employed throughout this disclosure, copper (Cu) is intended to encompass elemental Cu as well as Cu-based alloys substantially exhibiting the electrical properties of Cu.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus and/or a process in accordance with some embodiments. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIG. 1~FIG. 7 illustrate an exemplary embodiment of a TSV process, and cross-sectional diagrams of FIG. 8~FIG. 10 illustrate an exemplary embodiment of a three-dimensional stacking process using the TSV structure.

With reference now to FIG. 1, it is a cross-sectional diagram of a wafer 100 comprising a semiconductor substrate 10, an IC component 200 processed from the substrate 10, an inter-layer dielectric (ILD) layer 12 overlying the semiconductor substrate 10, and a contact plug 14 formed in the ILD layer 12 electrically connected with the IC component 200. In detail, the substrate 10 is typically silicon (Si), for example, a silicon substrate with or without an epitaxial layer, or a silicon-on-insulator substrate containing a buried insulator layer. The substrate 10 has a front surface 10a (e.g., circuit side) and a back surface 10b (e.g., non-circuit side). The IC component 200 formed in and/or on the front surface 10a of the substrate 10 may comprise multiple individual circuit elements such as transistors, diodes, resistors, capacitors, inductors, and/or other active and passive semiconductor devices formed by various integrated circuit manufacturing processes. The ILD layer 12 is formed on the substrate 10 so as to isolate the IC component 200 from a subsequent formation of an interconnection structure. The ILD layer 12 may be a single layer or a multi-layered structure. In some embodiments, the ILD layer 12 may be a silicon oxide containing layer formed of doped or undoped silicon oxide by a thermal CVD process or high-density plasma (HDP) process, e.g., undoped silicate glass (USG), phosphorous doped silicate glass (PSG) or borophosphosilicate glass (BPSG). In some alternative embodiments, the ILD layer 12 may be formed of doped or P-doped spin-on-glass (SOG), PTEOS, or BPTEOS. Following a dry etching process carried out, a contact hole is formed in the ILD layer 12, and a conductive material layer is deposited to fill the contact hole, forming a contact plug 14. The contact plug

PROCESS OF FORMING THROUGH-SILICON VIA STRUCTURE

CROSS-REFERENCE TO RELATED APPLICATIONS

The present application is a divisional application of U.S. patent application Ser. No. 12/783,973, filed May 20, 2010, which claims priority of U.S. Provisional Patent Application Ser. No. 61/186,575, filed on Jun. 12, 2009. The content of the above-referenced applications is incorporated herein by reference in its entirety.

TECHNICAL FIELD

The disclosure relates to a process of forming stacked integrated circuits, and particularly to a through-silicon via process for three-dimensional stacking technology.

BACKGROUND

Three-dimensional (3D) wafer-to-wafer, die-to-wafer or die-to-die vertical stack technology seeks to achieve the long-awaited goal of vertically stacking many layers of active IC devices such as processors, programmable devices and memory devices to shorten average wire lengths, thereby reducing interconnect RC delay and increasing system performance. One major challenge of 3D interconnects on a single wafer or in a die-to-wafer vertical stack is through-silicon via (TSV) that provides a signal path for high impedance signals to traverse from one side of the wafer to the other. Through-silicon via (TSV) is typically fabricated to provide the through-silicon via filled with a conducting material that passes completely through the layer to contact and connect with the other TSVs and conductors of the bonded layers. In general, Copper has become the metals of choice for the metallization of TSVs because copper has a lower electrical resistivity than most commonly used metals and a higher current carrying capacity. These characteristics are important for supporting the higher current densities experienced at high levels of integration and increased device speed. Further, copper has a good thermal conductivity and is available in a highly pure state. Previous attempts at filling the TSV with a high aspect ratio greater than 3:1, however, often produce TSVs with defects such as a void or a seam created within the conductive plug. The void or seam may cause a series of problems during the fabrication of electronic devices. Reliably producing the TSV is one of the key technologies for the three-dimensional stacking technology. As such, there is a great amount of ongoing effort being directed to the formation of void-free features.

BRIEF DESCRIPTION OF THE DRAWINGS

The aforementioned objects, features and advantages of various embodiments will become apparent by referring to the following detailed description of the embodiments with reference to the accompanying drawings, wherein.

DETAILED DESCRIPTION OF ILLUSTRATIVE EMBODIMENTS

Embodiments provide a metallization process for filling a high aspect ratio opening and a structure formed using the 14 may include tungsten, tungsten-containing alloy, copper, copper-containing alloy or combinations thereof.

Figure 1:
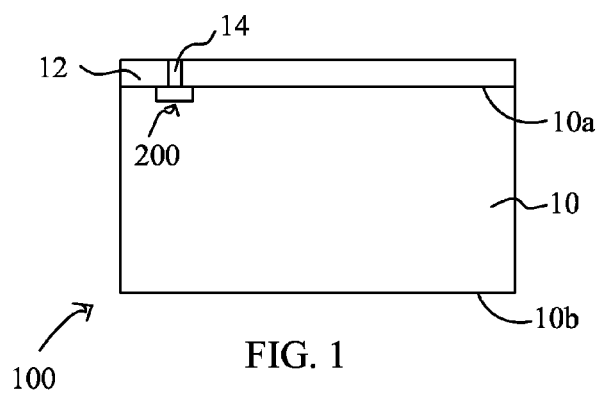
FIG. 1 to FIG. 7 are cross-sectional diagrams illustrating an exemplary embodiment of a TSV process.
Figure 2:
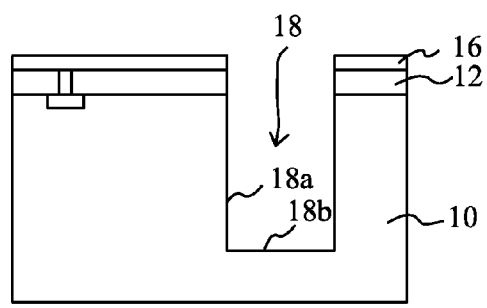

Referring to FIG. 2, the process proceeds to the formation of an opening 18 with a high aspect ratio greater than 5 in the substrate 10. In an embodiment of forming a TSV structure, the opening 18 is a TSV opening in which a metallization process will be performed. In defining the TSV opening 18, a hard mask layer 16 is formed on the ILD layer 12 followed by forming a patterned photoresist layer thereon. The hard mask layer 16 may be a silicon nitride layer, a silicon oxynitride layer or the like. The photoresist layer not shown in the figures is patterned by exposure, bake, developing, and/or other photolithography processes to provide an opening exposing the hard mask layer 16. The exposed hard mask layer 16 is then etched, by a wet etch or dry etch process, using the patterned photoresist layer as a masking element to provide an opening. Using the hard mask layer 16 and the patterned photoresist layer as mask elements, an etching process is performed to etching the exposed substrate 10, forming the TSV opening 18 with sidewalls 18a and a bottom 18b. The TSV opening 18 passes through at least a portion of the semiconductor substrate 10. In some embodiments, the TSV opening 18 may be etched using any suitable etching method including, for example, plasma etch, a chemical wet etch, a laser drill, and/or other processes known in the art. In an embodiment, the etching process includes a deep reactive ion etching (RIE) process to etch the semiconductor substrate 10. In some embodiments, the etching process may be such that the TSV opening 18 is etched from the front surface 10a to reach approximately tens of micron (μm)~hundreds of micron in depth without passing through the back surface 10b. The etching process may result in an opening having a vertical sidewall profile or a tapered sidewall profile. In an embodiment, the TSV opening 18 has a depth of approximately 20~100 μm, and a diameter of approximately 1.5~10 μm. The TSV opening 18 has a high aspect ratio between approximately 5 and approximately 10. In some embodiments, the aspect ratio of the TSV opening 18 is greater than 10.

Figure 3:
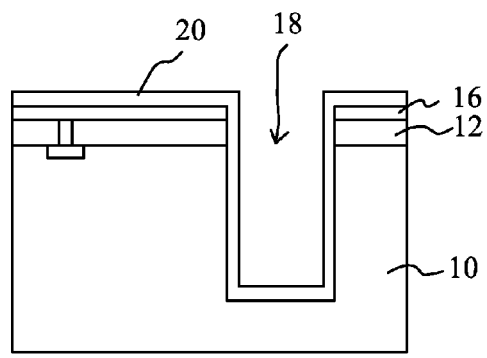

In FIG. 3, a passivation layer 20 is conformally deposited on the resulted structure to cover the hard mask layer 16 and line the sidewalls 18a and bottom 18b of the TSV opening 18 in order to prevent any conducting material from leaching into any active portions of the circuitry of the wafer 100. In some embodiments, the passivation layer 20 may be formed of silicon oxide, TEOS oxide, silicon nitride, combinations thereof, or the like. The deposition can be carried out using any of a variety of techniques, including thermal oxidation, LPCVD (low-pressure chemical vapor deposition), APCVD (atmospheric-pressure chemical vapor deposition), PECVD (plasma-enhanced chemical vapor deposition) and future-developed deposition procedures. For example, an LPCVD or PECVD process with tetraethylorthosilicate (TEOS) and $O_3$ may be employed to form a TEOS oxide film.

Figure 4:
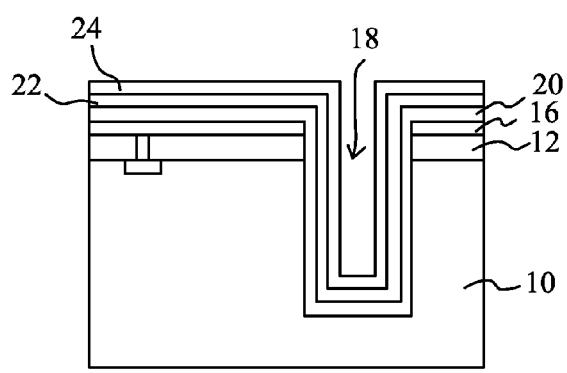

In FIG. 4, a barrier layer 22 is then formed on the passivation layer 20, lining the TSV opening 18. The barrier layer 22 functions as a diffusion barrier to prevent metal diffusion and as an adhesion layer between metal and dielectric. In some embodiments, refractory metals, refractory metal-nitrides, refractory metal-silicon-nitrides, or combinations thereof are typically used for the barrier layer 22. For example, TaN, Ta, Ti, TiN, TiSiN, WN, or combinations thereof may be used. In an embodiment, the barrier layer 22 includes a TaN layer and a Ta layer. In another embodiment, the barrier layer 22 is a TiN layer. In another embodiment, the barrier layer 22 is a Ti layer. Subsequently, a metal seed layer 24 is formed on the barrier layer 22. In an embodiment, the metal seed layer is a copper seed layer 24 that may be formed by physical vapor deposition. In some embodiments, other methods for forming copper seed layer 24, such as CVD, are used.

Figure 5:
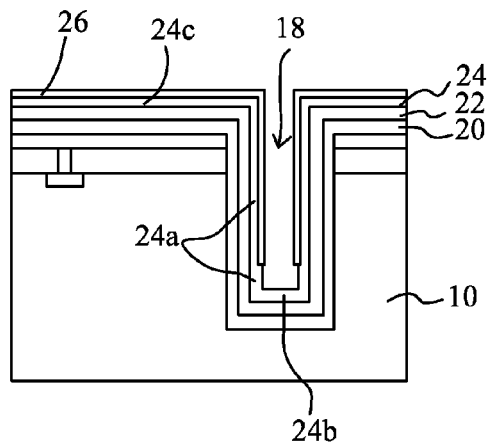

Referring to FIG. 5, a silicide formation process is performed after depositing the metal seed layer 24 to convert at least a portion of the exposed surface to a metal silicide layer 26. In some embodiments, the silicide formation process is a plasma-assisted metal silicide formation process. In an embodiment, when a copper seed layer 24 is deposited to provide sidewall portions 24a adjacent the sidewalls 18a of the TSV opening 18, a bottom portion 24b adjacent the bottom 18b of the TSV opening 18 and a surface portion 24c outside the TSV opening 18, a copper silicide layer 26 is then formed on the surface portion 24c and at least a portion of the sidewall portions 24a by a plasma-assisted copper silicide formation process. The metal silicide layer 26 may be less than 10 Angstroms. The plasma-assisted copper silicide formation process is conducted using a silicon-containing plasma, a $SiH_4$ plasma, a $Si_2H_6$ plasma, a 1MS plasma, a 2MS plasma, a 3MS plasma or a 4MS plasma under the following conditions: power from about 10 to 1000 watts, bias power from about 0 to 1000 watts, temperature from about 10 to 800.degree. C., time from about 0.1 to 100 seconds, and pressure from about 1 mTorr to 100 Torr.

Figure 5A:
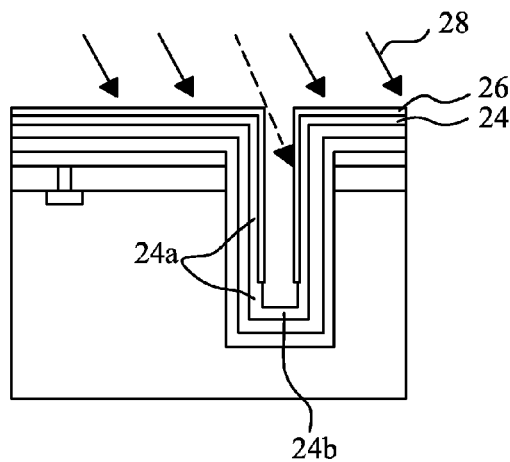
Figure 5B:
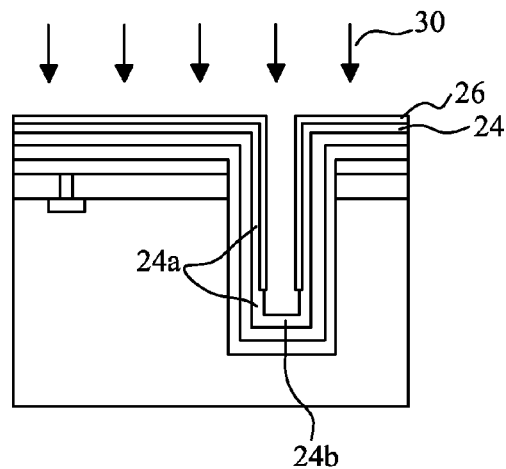

By controlling operation conditions, such as adjusting the pitch-angle distributions of plasma sheet electrons or tuning the bias power condition of the plasma process, the metal silicide layer 26 can be selectively formed on the sidewall portions 24a and/or the surface portion 24c of the metal seed layer 24, without being formed on the bottom portion 24b of the metal seed layer 24. The sidewall portions 24a may be entirely or partially reacted to form the metal silicide layer 26 thereon, while the bottom portion 24b is not reacted to form the copper silicide layer 26 thereon. FIG. 5A depicted an exemplary embodiment of forming a copper silicide layer 26 using a plasma treatment 28 with a tilted pitch-angle of plasma electrons, which makes the bottom portion 24b of the copper seed layer 24 free of the copper silicide layer 26. FIG. 5B depicted another exemplary embodiment of forming a copper silicide layer 26 using a plasma treatment 30 with a vertical pitch-angle of plasma electrons without bias power, which makes the sidewall portions 24a and surface portion 24c being reacted to form a copper silicide layer 26, leaving the bottom portion 24b free of the copper silicide layer 26.

Figure 6:
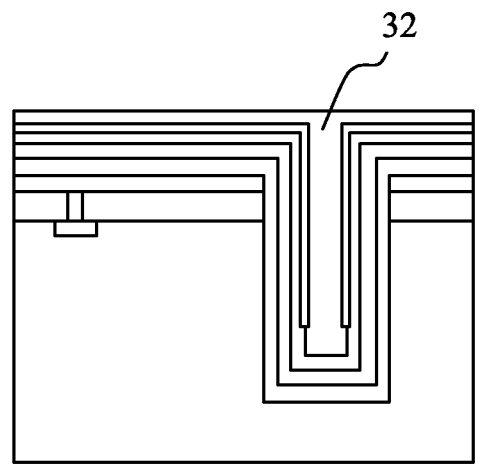

Referring to FIG. 6, the wafer 100 is transferred to a plating tool, such as an electrochemical plating (ECP) tool, and a metal layer 32 is plated on the wafer 100 by the plating process to fill the TSV opening 18. While ECP process is described herein, the embodiment is not limited to ECP deposited metal. The metal layer 32 may include a low resistivity conductor material selected from the group of conductor materials including, but is not limited to, copper and copper-based alloy. In some alternative embodiments, the metal layer may comprise various materials, such as tungsten, aluminum, gold, silver, or the like. In an embodiment, the metal layer 32 is a copper-containing layer formed over the copper seed layer 24, and the copper silicide layer 26 is sandwiched there between. With the formation of the copper silicide layer 26 on the sidewall portions 24a of the copper seed layer 24, the copper electroplating process can run faster and bottom-up fill the TSV opening 18. This electroplating process forms a void-free metallization structure to provide a reliable solution with high throughput for filling the high aspect ratio opening.

Figure 7:
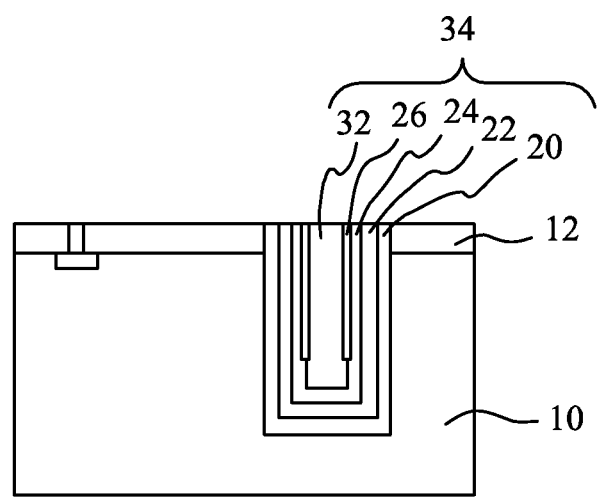

Subsequently, as shown in FIG. 7, the excess portions of the metal layer 32, the metal silicide layer 26, the metal seed layer 24, the barrier layer 22, the passivation layer 20 and/or the hard mask layer 16 outside the TSV opening 18 are removed, either through etching, chemical mechanical polishing (CMP), or the like, forming the upper surface of the metal-filed opening substantially coplanar with the upper surface of dielectric layer 12. The wafer 100 now comprises a TSV structure 34 formed in the ILD layer 12 and extending through a portion of the substrate 10. The TSV structure 34 includes the metal layer 32, the metal seed layer 24 surrounding the metal layer 32, the barrier layer 22 surrounding the metal seed layer 24, the passivation layer 20 surrounding the barrier layer 22, and the metal silicide layer 26 formed in a portion sandwiched between the metal seed layer 24 and the metal layer 32.

Figure 8:
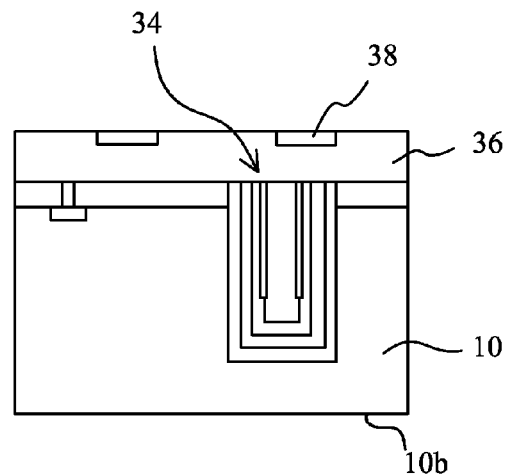
FIG. 8 to FIG. 10 are cross-sectional diagrams illustrating an exemplary embodiment of a three-dimensional stacking process using the TSV structure.

Next, back-end-of-line (BEOL) interconnection technologies are processed on the wafer 100 to fabricate an interconnection structure including a plurality of interconnection layers, redistribution layers, inter-metal dielectric (IMD) layers 36 and bonding contacts 38 as illustrated in FIG. 8. In an embodiment, a first-level interconnection layer is formed in an IMD layer to electrically connect with the contact plug 14 and the TSV structure 34 respectively, and thereafter another level interconnection layers and IMD layers are fabricated on the first-level interconnection layer, which are omitted in the drawings for clarity and convenience. Bonding contacts 38 are formed overlying a completed top-level interconnect layer and a top-level IMD layer. In some embodiments, copper-based conductive materials are used for forming the interconnection layers and the bonding contacts 38. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. A standard damascene process may be used with the copper BEOL interconnection.

Figure 9:
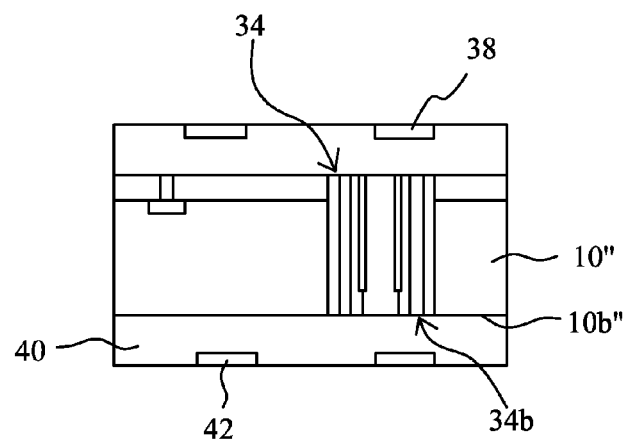
Figure 10:
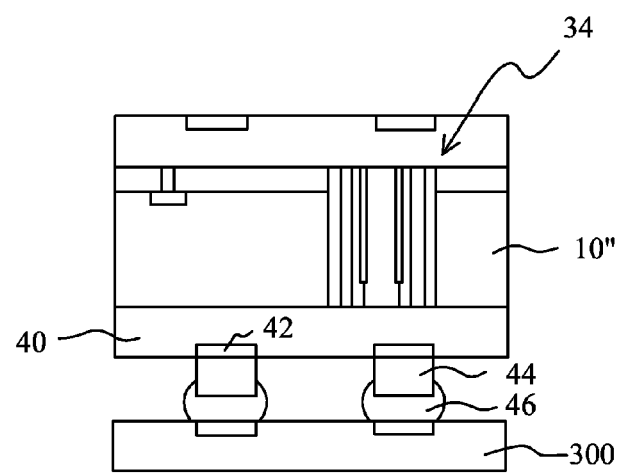

Referring to FIG. 9, the wafer 100 then undergoes a wafer thinning process and a backside metallization process. In an embodiment, the wafer 100 is attached to a carrier, and then the back surface 10*b* of the substrate 10 is processed to the desired final thickness, exposing the bottom end 34*b* of the TSV structure 34. This can be done, for example, through grinding, etching, and/or polishing, resulting in a thinned substrate 10" with a predetermined thickness depending on the purpose for which the semiconductor package is used. The thinned substrate 10" may have a thickness of from about 5 μm to about 180 μm. In an exemplary embodiment, the bottom 34*b* of the TSV structure 34 is exposed and/or protruded from the back surface 10*b*" of the thinned substrate 10" after the wafer thinning process. Backside metallization including electrical connections and/or other structures are formed on the back surface 10*b*" of the thinned substrate 10", including a backside dielectric layer 40 and bonding pads 42 for connecting external dies or a wafer. In FIG. 10, an external die or wafer 300 are bonded onto the wafer 100 wherein the bonding methods include oxide-to-oxide bonding, oxide-to-silicon bonding, copper-to-copper bonding, copper-to-solder bonding, adhesive bonding, or combinations thereof. In an embodiment, external contacts 44 of the individual semiconductor chips can be formed on the bonding pads 42 on the back surface 10*b*" of the thinned substrate 10" respectively for bonding to electrical terminals. The external contacts 44 may be solder bumps, copper-containing bumps or combinations thereof. A plurality of connecting elements 46 may be further provided so as to bond external dies 300 onto the wafer 100, forming a dies-to-wafer stack. The connecting elements may be solder bumps, copper-containing bumps or combinations thereof. In some embodiments, after dicing, the stacked chip or chips are mounted on an IC card through, for example, an anisotropically conductive connection film.

In a process in accordance with some embodiments, an opening is formed to extend from a front surface of a semiconductor substrate through at least a part of the semiconductor substrate. A metal seed layer is formed on a sidewall of the opening. A metal silicide layer is formed on at least one portion of the metal seed layer. A metal layer is formed on the metal silicide layer and the metal seed layer to fill the opening.

In a process in accordance with some embodiments, an opening is formed to extend from a front surface of a semiconductor substrate through at least a part of the semiconductor substrate. A metal seed layer is formed on a sidewall of the opening. A metal silicide layer is formed on the metal seed layer. A bottom of the opening is free of the metal silicide layer. A metal layer is formed on the metal silicide layer and the metal seed layer to fill the opening.

In a process in accordance with some embodiments, an opening is formed to extend from a front surface of a semiconductor substrate to at least a part of the semiconductor substrate. The opening has an aspect ratio greater than 5. A metal seed layer is formed in the opening. The metal seed layer comprises a sidewall portion adjacent to the sidewall of the opening, and a bottom portion adjacent to the bottom of the opening. A metal silicide layer is formed on at least a part of the sidewall portion of the metal seed layer. A metal layer is plated on the metal silicide layer and the metal seed layer to fill the opening.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A process, comprising:
   forming an opening extending from a front surface of a semiconductor substrate through at least a part of the semiconductor substrate;
   forming a metal seed layer on a sidewall of the opening;
   forming a metal silicide layer on at least one portion of the metal seed layer; and
   forming a metal layer on the metal silicide layer and the metal seed layer to fill the opening,
   wherein the metal seed layer comprises a bottom portion adjacent to a bottom of the opening, and the metal silicide layer is not formed on the bottom portion of the metal seed layer.

2. The process of claim 1, wherein the metal silicide layer comprises copper.

3. The process of claim 1, wherein the metal layer comprises copper, and the metal seed layer comprises copper.

4. The process of claim 1, further comprising:
   forming a barrier layer lining the opening before forming the metal seed layer, wherein barrier layer comprises at least one selected from the group consisting of TaN, Ta, TiN, and Ti.

5. The process of claim 4, further comprising:
   forming a passivation layer lining the opening before forming the barrier layer.

6. The process of claim 5, wherein the passivation layer comprises silicon oxide.

7. The process of claim 1, further comprising:
performing a thinning process on a back surface of the semiconductor substrate to expose an end of the metal layer.

8. The process of claim 7, further comprising:
stacking a semiconductor component on the back surface of the semiconductor substrate, the semiconductor component electrically connected to the exposed end of the metal layer.

9. A process, comprising:
forming an opening extending from a front surface of a semiconductor substrate through at least a part of the semiconductor substrate;
forming a metal seed layer on a sidewall of the opening;
forming a metal silicide layer on the metal seed layer, wherein a bottom of the opening is free of the metal silicide layer; and
forming a metal layer on the metal silicide layer and the metal seed layer to fill the opening.

10. The process of claim 9, further comprising, before forming the metal seed layer:
forming a passivation layer lining the opening; and then
forming a barrier layer over the passivation layer.

11. The process of claim 10, wherein the semiconductor substrate includes an integrated circuit (IC) component formed on the front surface, the process further comprising:
forming an interlayer dielectric (ILD) layer over the front surface of the semiconductor substrate; and
forming a contact plug in the ILD layer, the contact plug electrically coupled to the IC component,
wherein the opening is formed through the ILD layer.

12. The process of claim 11, further comprising:
performing a thinning process on a back surface of the semiconductor substrate to expose an end of the metal layer; and
stacking a semiconductor component on the back surface of the semiconductor substrate, the semiconductor component electrically connected to the exposed end of the metal layer.

13. The process of claim 9, further comprising:
forming a backside dielectric layer over a back surface of the semiconductor substrate; and
forming an external contact on the backside dielectric layer.

14. The process of claim 13, wherein the external contact comprises at least one selected from the group consisting of a solder bump and a copper-containing bump.

15. A process, comprising:
forming an opening extending from a front surface of a semiconductor substrate to at least a part of the semiconductor substrate, wherein the opening has an aspect ratio greater than 5;
forming a metal seed layer in the opening, wherein the metal seed layer comprises a sidewall portion adjacent to the sidewall of the opening, and a bottom portion adjacent to the bottom of the opening;
forming a metal silicide layer on at least a part of the sidewall portion of the metal seed layer; and
plating a metal layer on the metal silicide layer and the metal seed layer to fill the opening,
wherein the metal silicide layer is not formed on the bottom portion of the metal seed layer.

16. The process of claim 15, wherein each of the metal seed layer, the metal silicide layer and the metal layer comprises copper.

17. The process of claim 15, further comprising:
forming a barrier layer lining the opening before forming the metal seed layer.

18. The process of claim 17, further comprising:
forming a passivation layer lining the opening before forming the barrier layer.

19. The process of claim 15, further comprising:
performing a thinning process on a back surface of the semiconductor substrate to expose the metal layer.

* * * * *